United States Patent
Mitrovic (10) Patent No.: US 7,208,067 B2
(45) Date of Patent: Apr. 24, 2007

(54) METHOD AND SYSTEM FOR MONITORING RF IMPEDANCE TO DETERMINE CONDITIONS OF A WAFER ON AN ELECTROSTATIC CHUCK

(75) Inventor: Andrej S Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 308 days.

(21) Appl. No.: 10/807,439

(22) Filed: Mar. 24, 2004

(65) Prior Publication Data

US 2004/0188021 A1 Sep. 30, 2004

Related U.S. Application Data

(60) Provisional application No. 60/457,589, filed on Mar. 27, 2003.

(51) Int. Cl.
*H01L 21/00* (2006.01)
*C23C 16/00* (2006.01)
*C23C 14/00* (2006.01)

(52) U.S. Cl. ............... 156/345.27; 156/345.53; 156/345.28; 279/128; 361/234

(58) Field of Classification Search ........... 156/345.27, 156/345.53, 345.28; 279/128; 361/234
See application file for complete search history.

(56) References Cited

U.S. PATENT DOCUMENTS 5,556,204 A * 9/1996 Tamura et al. .............. 374/161
5,810,933 A * 9/1998 Mountsier et al. .......... 118/724
5,812,361 A    9/1998 Jones et al.
6,622,286 B1   9/2003 Ngo et al.
2002/0048311 A1  4/2002 Norrbakhsh et al.
2002/0086546 A1* 7/2002 Yamashita et al. .......... 438/710
2003/0038114 A1* 2/2003 Howald ....................... 216/67

FOREIGN PATENT DOCUMENTS

EP 0 849 766 A2    6/1998
JP    02228546 A  * 9/1990
WO  WO 01/50109 A2  7/2001
WO  WO 01/52302 A1  7/2001
WO  WO 02/33369 A1  4/2002

OTHER PUBLICATIONS

U.S. Appl. No. 60/259,862, filed Jan. 8, 2001, Mitrovic.
U.S. Appl. No. 60/268,913, filed Feb. 16, 2001, Mitrovic.

* cited by examiner

*Primary Examiner*—Ram Kackar
(74) *Attorney, Agent, or Firm*—Pillsbury Winthrop Shaw Pittman LLP (57) ABSTRACT

A method and system for monitoring and/or controlling the conditions of a wafer on an electrostatic chuck during plasma processing. The method and system include utilizing backflow gas pressure and DC clamping voltage as control variables to adjust the wafer temperature based upon impedance measurements determined by RF sensors located in the electrostatic chuck RF feed line. The method and system further include utilizing the clamping status of the wafer on the electrostatic chuck to monitor impedance during the plasma process.

8 Claims, 8 Drawing Sheets

METHOD AND SYSTEM FOR MONITORING RF IMPEDANCE TO DETERMINE CONDITIONS OF A WAFER ON AN ELECTROSTATIC CHUCK

This non-provisional application claims the benefit of U.S. Provisional Application No. 60/457,589, filed Mar. 27, 2003, and incorporates the content of same in its entirety by reference.

BACKGROUND OF THE INVENTION

1. Field of the Invention

The invention generally relates to the field of semiconductor processing. More particularly, the invention relates to monitoring wafer condition in a plasma processing system.

2. Background Information

The temperature of a substrate during plasma processing affects device quality and yield. For example, the etch process, e.g., etch selectivity, is dependent upon the wafer temperature. Wafer gas backflow cooling may be used to increase the amount of heat transferred from a wafer to a chuck.

The main chuck structure, for example, the chuck block, may be made of a material that has a high thermal conductivity which allows heat transferred from the wafer to be absorbed by a cooling system, which typically consists of a liquid coolant flow channel, a circuit with thermoelectric coolers, or a combination thereof. The high heat conductivity ensures that the chuck block maintains a relatively uniform temperature throughout its volume even at high plasma heat loads.

The wafer is typically held on an electrostatic chuck by an electrostatic attractive clamping force. The electrostatic attractive clamping force is exerted on the wafer by one or more chucking electrodes, embedded within the chuck, and biased to a high DC voltage. At the same time that the electrostatic attractive clamping force is exerted, a heat transfer gas, such as helium or argon, may be injected into the microscopic gap that remains between the chuck and wafer. The heat transfer gas is typically at pressures much higher than the process chamber pressure, to enhance the heat transfer between the wafer and chuck.

SUMMARY OF THE INVENTION

In an embodiment of the present invention, a system and method applicable to a variety of plasma processes, is utilized to permit wafer temperature monitoring and/or wafer temperature control using data obtained from existing sensors on a plasma processing tool, or an in-situ wafer temperature measurement system, to monitor and/or control wafer conditions based on radio frequency (RF) impedance measurements within the plasma processing system.

BRIEF DESCRIPTION OF THE DRAWINGS

The above and other features of the present invention are further described in the detailed description which follows, with reference to the drawings, and by way of a non-limiting exemplary embodiment of the present invention, wherein like reference numerals represent similar parts of the present invention throughout the several views and wherein.

DETAILED DESCRIPTION OF THE EMBODIMENTS

The following detailed description of the present invention refers to the accompanying drawings that illustrate exemplary embodiments consistent with this invention. Other embodiments are possible and modifications may be made to the embodiments without departing from the spirit and scope of the invention. Therefore, the following detailed description is not meant to limit the invention. Rather the scope of the invention is defined by the appended claims.

Figure 1A:
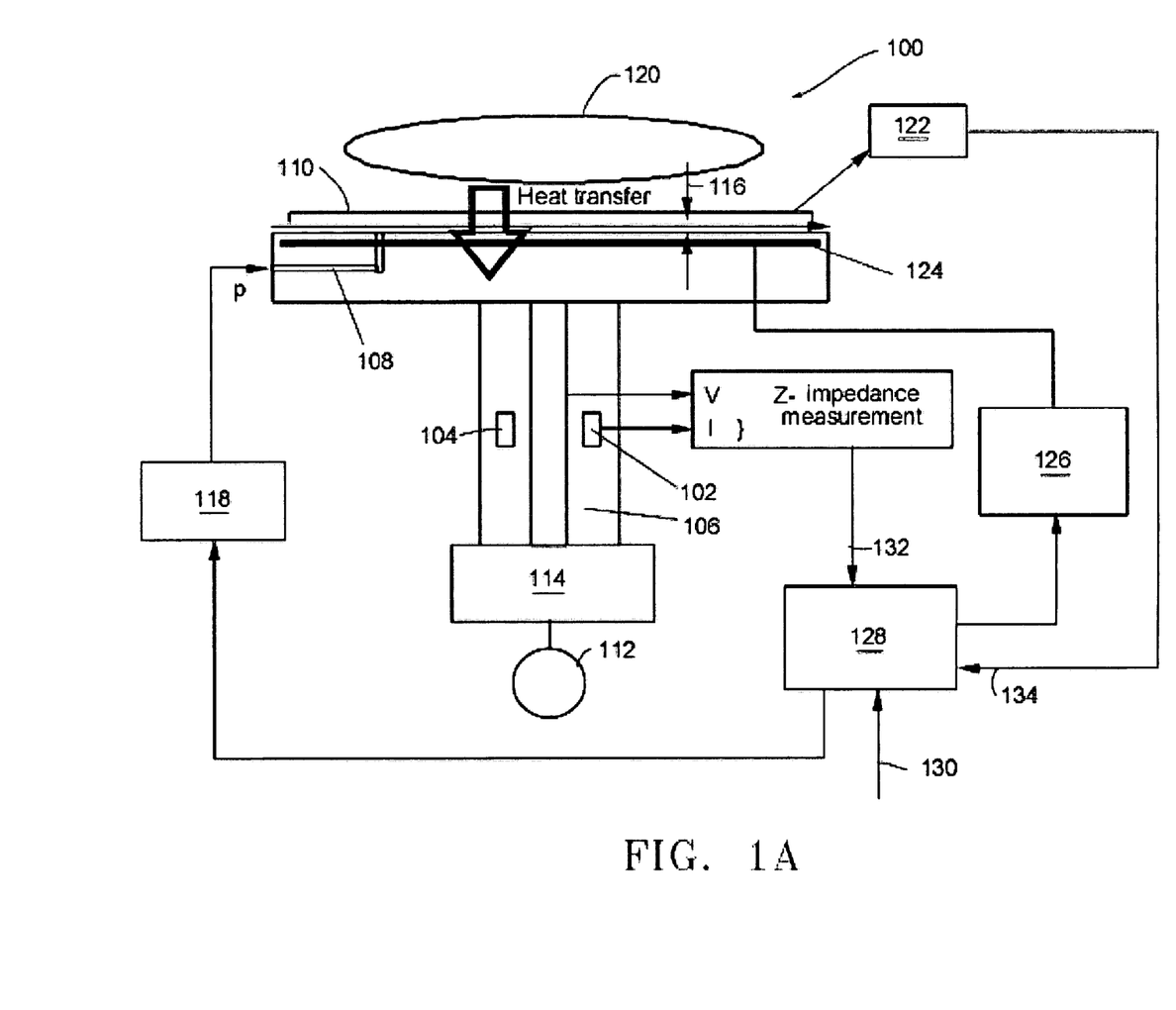
FIG. 1A illustrates a system for monitoring and controlling wafer temperature in accordance with an embodiment of the present invention.

Referring now more particularly to the drawings, FIG. 1A illustrates a system 100 for monitoring and controlling wafer temperature in accordance with an embodiment of the present invention when the system is operating in an experimental or calibration mode.

In system 100 of FIG. 1A, an electrical source, such as an RF generator 112 is coupled to an electrostatic chuck 108 through a matching network 114 and transmission line such as RF feed line 106. System 100 further includes a voltage sensor 104 and current sensor 102 installed in the RF feed line 106. The RF feed line 106 is used to supply RF bias power to the electrostatic chuck 108 to attract ions and control their energy at the wafer 110. The voltage sensor 104 and current sensor 102 may be implemented as disclosed in provisional application 60/259,862, filed Jan. 8, 2001, the contents of which are incorporated herein by reference. As depicted in FIG. 1A, the voltage sensor 104 is incorporated into a transmission line having an inner conductor, an outer conductor and dielectric material therebetween. RF voltage may be sampled or sensed by the voltage sensor 104, and RF current may be sampled or sensed by the current sensor 102. The voltage and current measurements can be readily converted into RF impedance using formulae known to those skilled in the art. The calculated RF impedance measurements may be entered into a table for reference in wafer temperature control system 128. During experimental or calibration runs, temperature measurements of wafer 110 may be taken by wafer temperature measurement system 122 and input to the wafer temperature control system 128 via input 134. The temperature measurements are correlated to the RF impedance measurements, for a given set of plasma processing system operating parameters. With an established correlation the wafer temperature control system 128 can control the dc clamping voltage power supply 126, and voltage supplied to clamping electrode 124, and the gas flow/pressure controller 118 that controls the back flow gas pressure to the electrostatic chuck 108.

During any run (both calibration and actual wafer processing), the calculated RF impedance derived from the voltage and current measurements at sensors 104 and 102, respectively, is for a given processing system, dependent on a number of factors such as plasma generator RF power, chuck RF power, chamber pressure, the chemistry used for processing, the type of wafer being processed, etc. One parameter of interest is the RF impedance that depends upon the thickness of the gas gap 116 between the wafer 110 and the electrostatic chuck 108, because the gas gap 116 acts as a series capacitor in the wafer bias RF drive circuit, and modifies the RF impedance that is measured at voltage and current sensors 104 and 102. The thickness of gas gap 116 in turn depends on the DC clamping voltage, generated by power supply 126, and the backflow gas pressure determined by the setpoint of the flow/pressure control system 118. For example, increasing the DC clamping voltage reduces the gas gap thickness, while increasing the backflow gas injection pressure counteracts the developed clamping force and increases the gas gap thickness. In general, a higher pressure and a thinner gap permit a higher heat transfer coefficient to be obtained, and thus a lower wafer temperature. Therefore, changes in the backflow gas pressure or DC clamping voltage, both of which the gas gap 116 is dependent upon, can be sensed as changes in the RF impedance, which may be calculated using the measurements of the sensors 102 and 104. Since the heat transfer coefficient between the wafer 110 and chuck 108 is controlled by the thickness of the gas gap 116, and the thickness of the gas gap can be correlated to the RF impedance, the temperature of the wafer 110 can be correlated to the RF impedance.

Figure 1B:
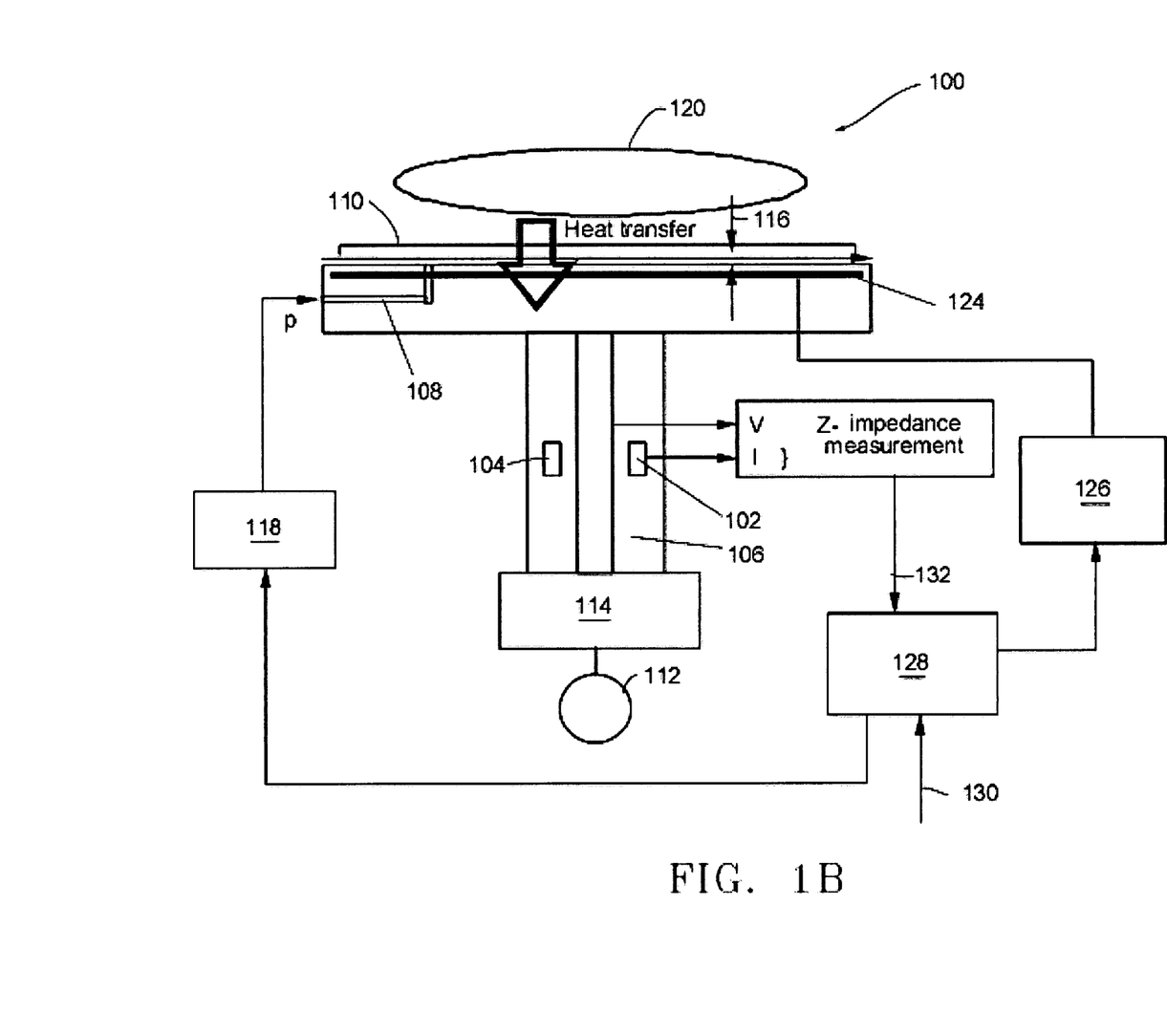
FIG. 1B illustrates a system for monitoring and controlling wafer temperature in accordance with another embodiment of the present invention.

FIG. 1B illustrates the system 100 for monitoring and controlling wafer temperature in accordance with an embodiment of the present invention during the actual run mode of the processing system, e.g. during actual wafer processing. During run mode of the processing system, the wafer temperature measurement system 122 depicted in FIG. 1A is not a necessary part of the system since the temperature of the wafer may be obtained from the correlated RF impedance data stored from calibration at wafer temperature control system 128, provided all other parameters of the plasma processing system are set the same as during the calibration.

Figure 2A:
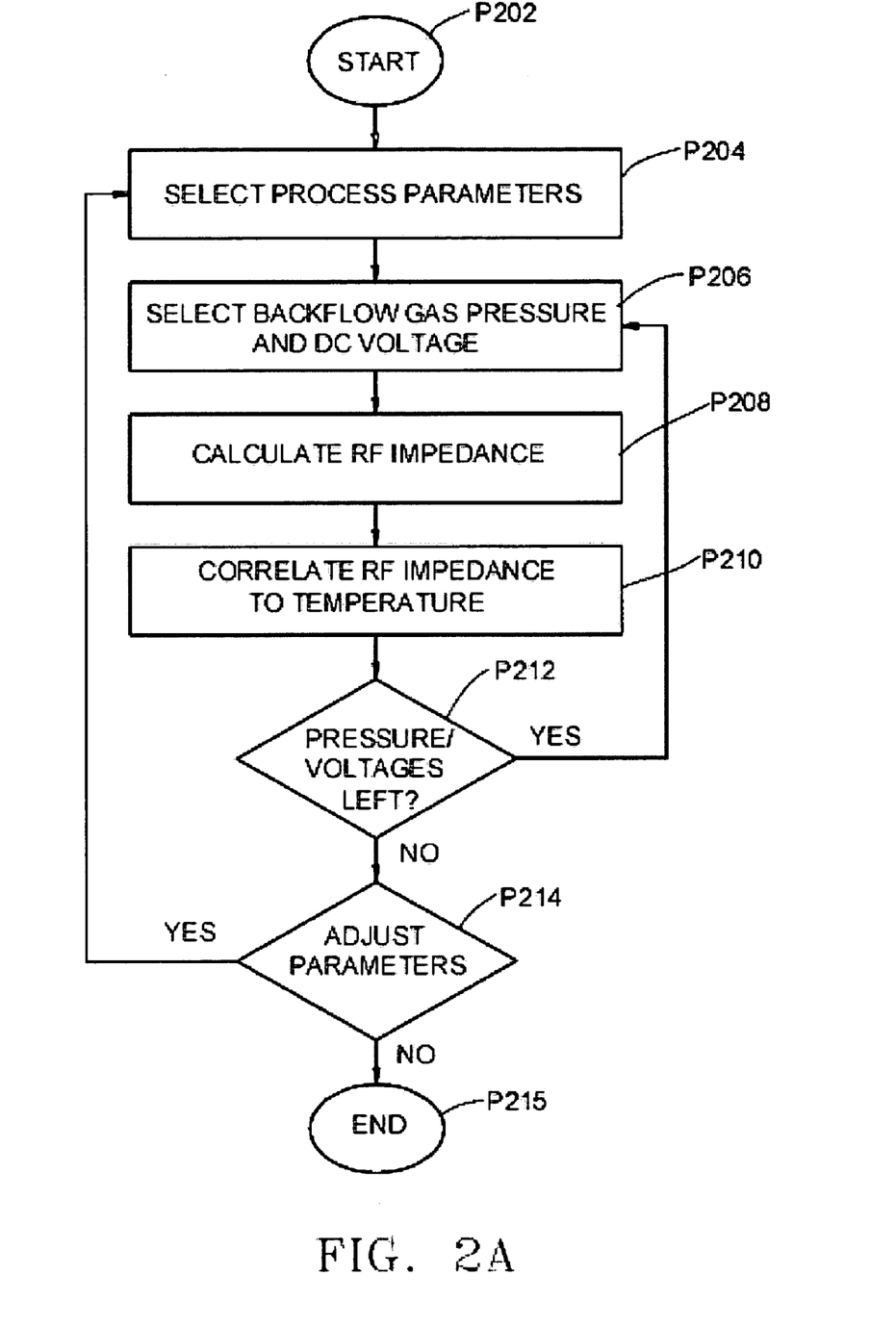
FIG. 2A illustrates a calibration flow diagram for a monitoring and control system in accordance with an embodiment of the present invention.
Figure 2B:
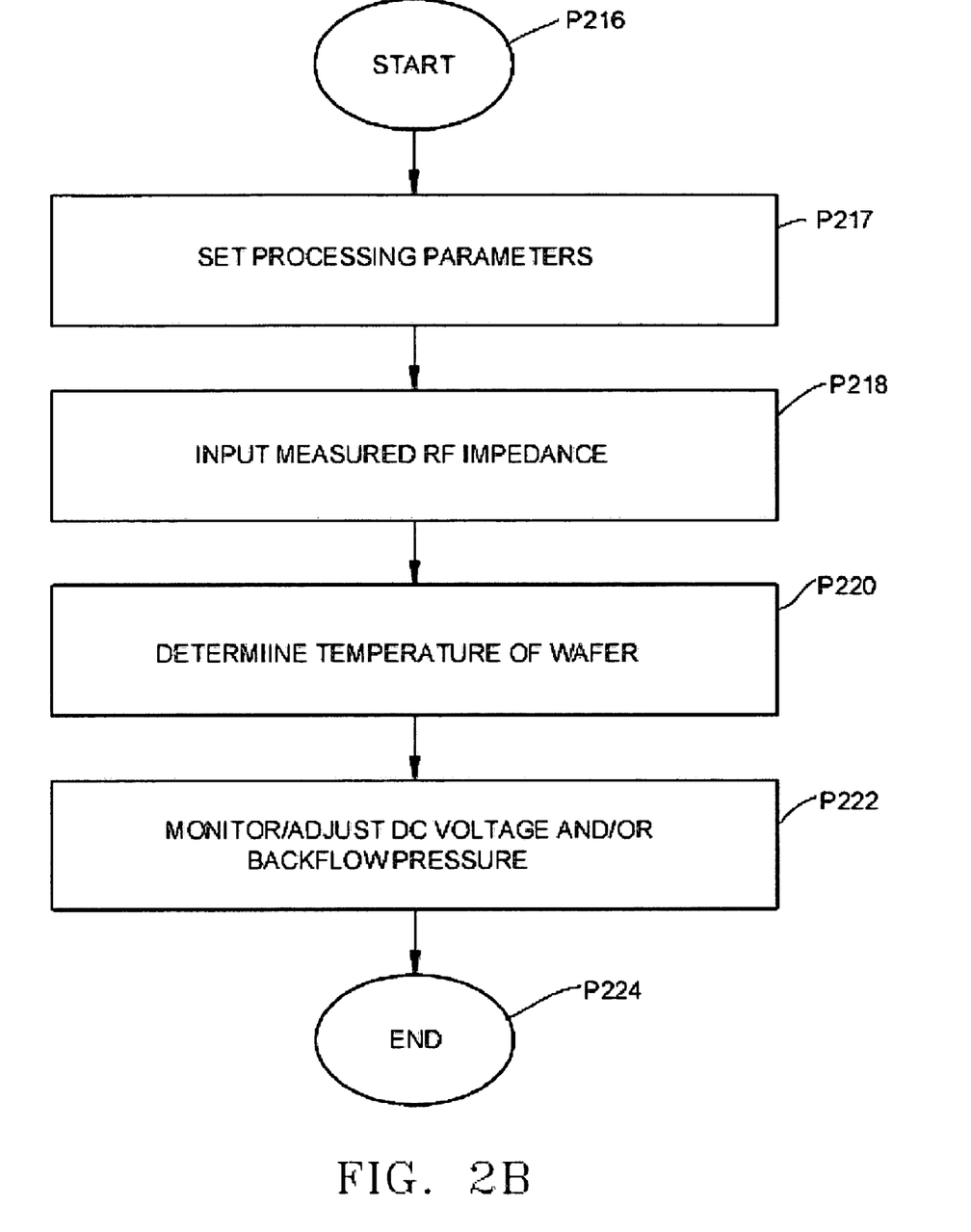
FIG. 2B illustrates a run time flow diagram for a monitoring and control system in accordance with an embodiment of the present invention.

FIGS. 2A and 2B illustrate flow diagrams for a processing system in accordance with an embodiment of the present invention. FIG. 2A represents a experimental or calibration process. The process begins at P202. At P204, a set of plasma processing parameters is selected for an experimental run. The plasma processing parameters may include processing gas composition and flow, processing gas pressure, RF power applied to the plasma source and chuck, process chamber temperature, chuck cooling fluid temperature and flow, and/or type of wafer. At P206, the backflow gas pressure and DC clamping voltage are selected by the user or automatically by the control system 128 from a user-defined list of values. The number of values that the DC clamping voltage and backflow gas pressure are varied over is defined by the user depending on the target process to be run on the processing system. If little variation of these two parameters is expected, then a small number of values may be used, such as 3 to 5 values over a relatively small range. Where more variation is expected, or if there is any kind of uncertainty as to the final process recipe, more values may be used, such as 10 to 20, and over a wider range. DC clamping voltage typically is in the range of 500 to 2000V, and the backflow pressure varies from 1 Torr to 100 Torr, and more typically from 4 Torr to 40 Torr. The number of necessary points can be kept low because of the ability of temperature control system 128 to interpolate between calibration points for DC clamping voltage and backflow gas pressure. At P208, for the particular set of processing parameters and backflow gas pressure and DC clamping voltage values selected, voltage and current measurements are taken by voltage and current sensors 104 and 102, respectively. The voltage and current measurements are used to calculate RF impedance at one or more predetermined frequencies.

At P210, the calculated RF impedance of P208 is correlated to the wafer temperature measured during the experimental run process using in-situ wafer temperature measurement system 122, as depicted in FIG. 1A. The correlation may be made simply by establishing a lookup table of wafer temperature vs. impedance, or using a number of available statistical correlation methods known in the art, such as principal components analysis and partial least squares.

At P212, it is determined whether there are any remaining sets of backflow gas pressure and DC clamping voltage that need to be set for measurements during the experimental or calibration run. If yes, then the process returns to P206 where a new pair of backflow gas pressure and DC clamping voltage is selected. If no further combinations of backflow gas pressure and DC clamping voltage are left, then the process continues to P214.

At P214, it is determined whether additional experimental runs need to be conducted using other sets of processing parameters. The sets of plasma processing parameters selected represent hypothetical scenarios of values that may occur during an actual processing run, and the number of scenarios depends on the amount of variability expected for the process recipe during actual device manufacturing. Typically, during process development phase, wide ranges of process parameters are evaluated, in part to determine the "process window". During process development, it is typical to have temperature measurements of the wafer done directly using temperature measurement system 122, because process development tools are typically better equipped with diagnostics than device manufacturing tools. Once the best process recipe has been found, the abovementioned experimental or calibration runs can be made over ranges of process parameters centered upon the best process condition, and without many values taken for each parameter (even as little as 2 to 4 values may suffice). With the system calibration done over these tighter ranges centered upon the best process condition, one can use the system to measure wafer temperature in a device production tool that does not possess a temperature measurement system 122, as long as the process condition used does not deviate much from the best condition and stays within the range of process parameter variation used during calibration. The number of necessary points is also reduced by the ability of temperature control system 128 to interpolate between sets of plasma processing conditions. If additional experimental runs are required, then the process returns to P204 and a new set of plasma processing parameters is selected. If no additional experimental runs are necessary, then the process ends at P215.

FIG. 2B represents a process during an actual run. The process begins at P216. At P217, the plasma processing parameters are set in accordance with values desired for an actual processing run. These processing parameters 130 are input to the wafer temperature control system 128. At P218, and during processing, measured RF impedance 132 is input to the wafer temperature control system 128. At P220 the temperature of the wafer 110 is determined by interpolation within the set of calibration points, or using correlations determined during calibration runs. Interpolation and correlation among the calibration data sets can be used to compensate for deviations from exact values of plasma processing parameters, DC clamping voltage, and backflow gas pressure used in the experiment and calibration runs of FIG. 2A. The in-situ temperature measurement system 122 is thus unnecessary in actual runs, and wafer temperature measurements are made using readings from the RF voltage and current sensors on the chuck RF drive, which exist on most typical device production plasma processing tools currently used in the art.

At P222, the wafer temperature control system 128 monitors and, if desired, adjusts the backflow gas supply controller 118 and the DC clamping voltage power supply 126, both of which may be used to control the gas gap 116 thickness; thus, controlling the wafer temperature. The process ends at P224.

Figure 3A:
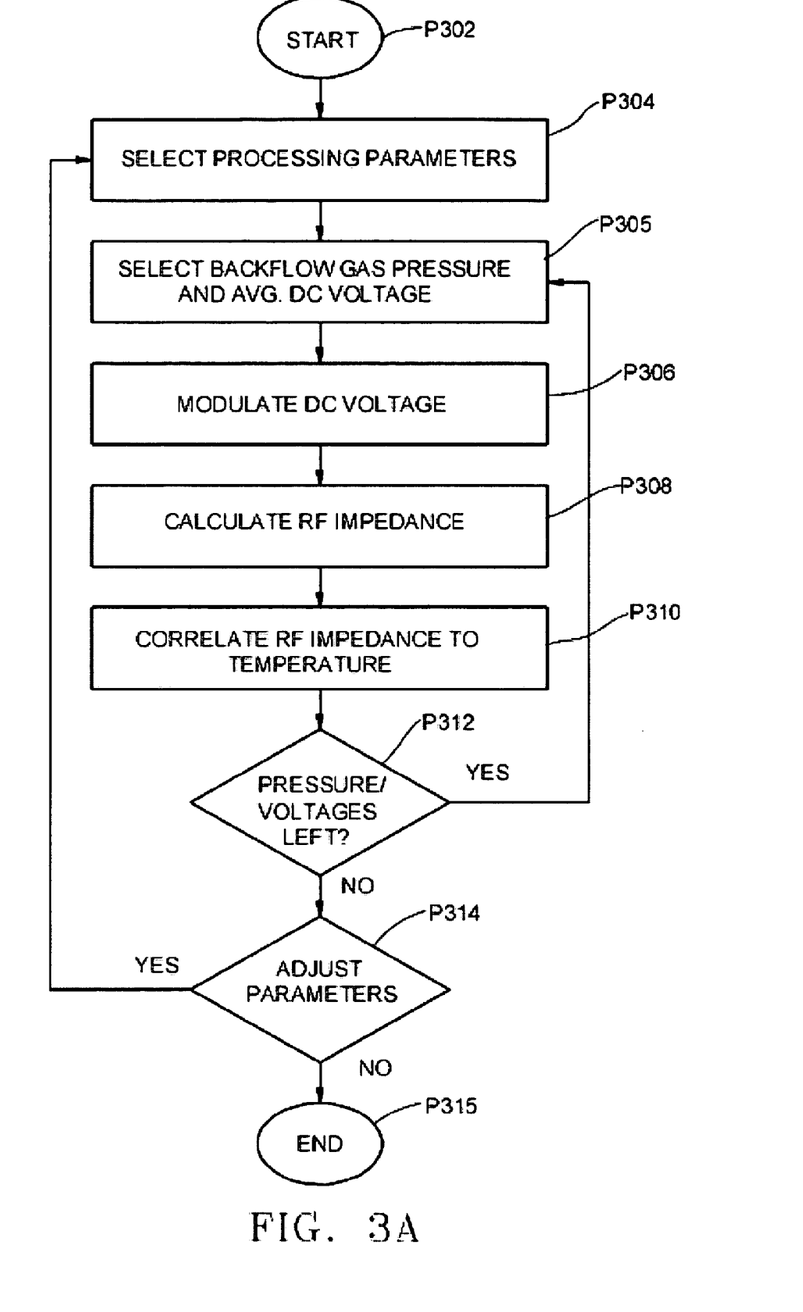
FIG. 3A illustrates a calibration flow diagram for a monitoring and control system in accordance with another embodiment of the present invention.
Figure 3B:
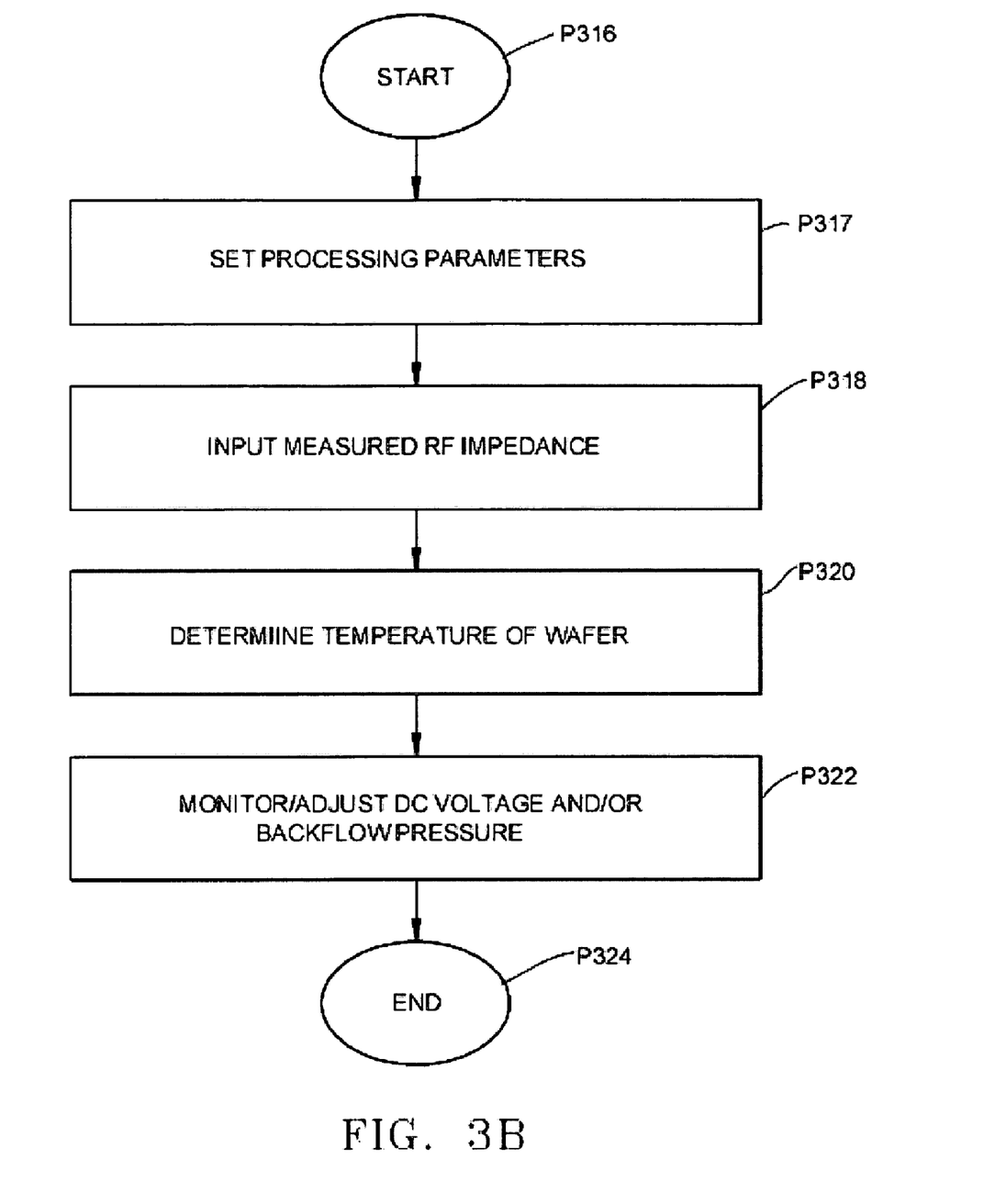
FIG. 3B illustrates a run time flow diagram for a monitoring and control system in accordance with another embodiment of the present invention.

During the wafer processing illustrated in FIG. 2B, there exists the possibility that processing parameters may change undetected, thus, causing the calculated RF impedance to change and produce a false reading of a change of wafer temperature. To address this scenario, FIGS. 3A and 3B illustrate flow diagrams for a processing system in accordance with another embodiment of the present invention that reduces temperature reading errors. FIG. 3A, represents an experimental or calibration process. The process begins at P302. At P304, a set of plasma processing parameters is selected for an experimental run. The processing parameters may include processing gas composition and flow, processing gas pressure, RF power applied to the plasma source and chuck, process chamber temperature, chuck cooling fluid temperature and flow, and type of wafer. At P305, the backflow gas pressure and average DC clamping voltage are selected by the user or automatically by the control system 128 from a user-defined list of values. The number of values that the DC clamping voltage and backflow gas pressure are varied over is defined by the user depending on the target process to be run on the processing system.

At P306, the output DC voltage of the DC clamping voltage power supply 126 is modulated about the mean (average) value at a predetermined frequency $f_{mod}$ while the backflow gas pressure is held constant. Mean (average) DC clamping voltage typically is in the range of 500 to 2000V, and the backflow pressure varies from 1 Torr to 100 Torr, and more typically from 4 Torr to 40 Torr. The DC clamping voltage may be modulated at multiple frequencies to further improve the correlations and measurement accuracy.

The frequency of the modulation is selected within the range from 1 Hz to 10 kHz. It should be high enough to not cause the wafer temperature to oscillate during the modulation period, e.g., a frequency lower than about 1 Hz may cause oscillation because it is of the same order of value of the thermal time constant of the wafer. Additionally, the frequency of the modulation should not be so high to cause additional plasma excitation, e.g. higher that about 10 kHz. More particularly, the modulation frequency, or multiple frequencies, should be in a range that causes the wafer gas gap thickness to oscillate, e.g. in the 10 Hz to 1000 Hz range, so that the wafer-chuck gas gap can change, similar to the motion of a loudspeaker membrane.

Figure 4:
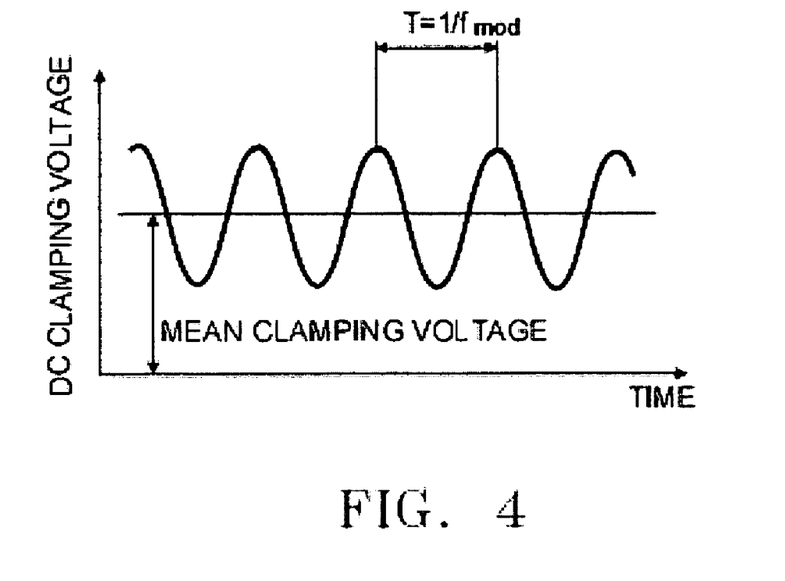
FIG. 4 shows the variation of the wafer clamping voltage as a function of time, in accordance with an embodiment of the present invention.

FIG. 4 illustrates the variation of the wafer clamping voltage as a function of time. The mean (average) wafer clamping voltage corresponds to the DC clamping voltage described in FIGS. 2A and 2B. At least one sine wave voltage signal at a modulation frequency is superimposed on the mean clamping voltage, and the oscillating total voltage causes the wafer-chuck gas gap 116 thickness to oscillate at the same modulation frequency.

The amplitude of the superimposed sine wave voltage does not need to be excessive—just enough amplitude is needed that would cause a measurable peak to appear in the measured RF impedance spectrum explained below. The sine wave amplitude needs to satisfy the condition that the wafer clamping force never becomes smaller than the pressure force acting on the wafer from the backside cooling gas present in the gas gap, e.g. at the voltage minima (and thus clamping force minima). A superimposed sine wave of approximately 150V amplitude, or about 10% of a typical mean clamping voltage of 1500V, is sufficient in most cases. If, at the voltage minima, the pressure force exceeds the clamping force, the wafer may de-chuck and fly off the electrostatic chuck, resulting in serious tool down-time, and possibly damage.

Figure 5:
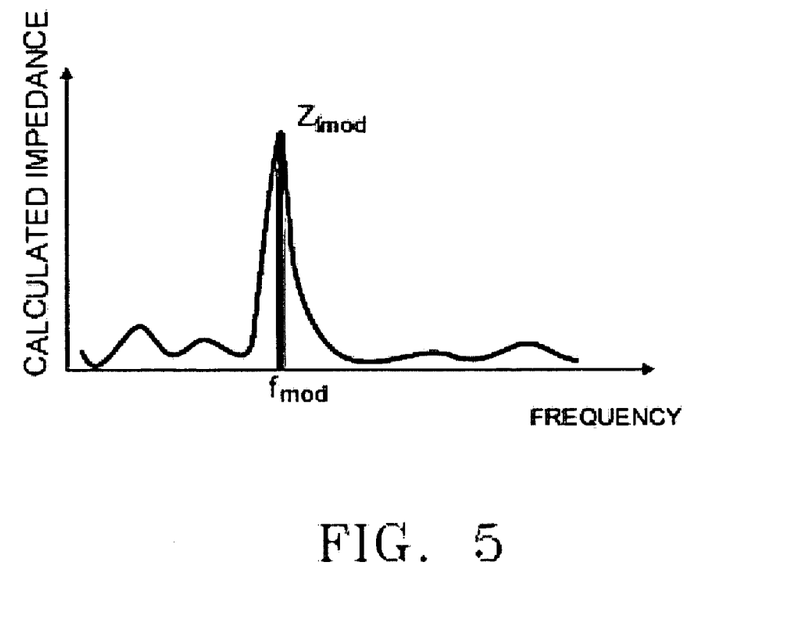
FIG. 5 illustrates an RF impedance spectrum in accordance with an embodiment of the present invention.

Returning to FIG. 3A, at P308, for the particular set of plasma processing parameters and backflow gas pressure and average DC clamping voltage values selected, the RF impedances are calculated based upon measurements taken at the one or more modulation frequencies $f_{mod}$. FIG. 5 illustrates a resulting RF impedance spectrum near a single modulation frequency $f_{mod}$. As illustrated in FIG. 5, a peak appears at the modulation frequency, $f_{mod}$, which is very highly correlated to the gas gap thickness based upon the gas gap oscillation at the $f_{mod}$ frequency. As such, a measurable feature is generated in the RF impedance spectrum of FIG. 5 that depends on other parameters in the plasma processing system far less than in the previously described embodiment.

At P310 of FIG. 3A, the wafer temperature is measured directly by in-situ wafer temperature measurement system 122. The temperature measurement is supplied to the wafer temperature control system 128 as input at 134. The RF impedance calculated at P308 is correlated to the wafer temperature measurements to obtain a relationship between RF impedance and temperature at the selected gas gap pressure and average DC clamping voltage values and for the particular processing parameters used in the experimental run.

At P312, it is determined whether there is any remaining set of backflow gas pressure and average DC clamping voltage that need to be set for measurements. If yes, then the process returns to P305 where a new pair of backflow gas pressure and average DC voltage is selected. If no further combinations of backflow gas pressure and average DC clamping voltage are left, then the process continues to P314.

At P314, it is determined whether additional experimental and calibration runs need to be conducted using another set of processing parameters. The sets of plasma processing parameters selected represent hypothetical scenarios of values that may occur during an actual processing run, and the number of scenarios depends on the amount of variability expected for the process recipe during actual device manufacturing. Typically, during process development phase, wide ranges of process parameters are evaluated, in part to determine the "process window". During process development, it is typical to have temperature measurements of the wafer done directly using temperature measurement system 122, because process development tools are typically better equipped with diagnostics than device manufacturing tools. Once the best process recipe has been found, the abovementioned experimental or calibration runs can be made over ranges of process parameters centered upon the best process condition, and without many values taken for each parameter (even as little as 2 to 4 values may suffice). With the system calibration done over these tighter ranges centered upon the best process condition, one can use the system to measure wafer temperature in a device production tool that does not possess a temperature measurement system 122, as long as the process condition used does not deviate much from the best condition and stays within the range of process parameter variation used during calibration. The number of necessary points is also reduced by the ability of temperature control system 128 to interpolate between sets of plasma processing conditions. If additional experimental runs are required, then the process returns to P304 and a new set of processing parameters is selected. If no additional experimental runs are necessary, then the process ends at P315.

FIG. 3B represents a process during an actual wafer run. The process begins at P316. At P317, the plasma processing parameters are set in accordance with values desired for an actual processing run. The processing parameter values are input 130 to the wafer temperature control system 128. At P318, the DC clamping voltage is modulated at, at least one frequency $f_{mod}$ and the RF impedance is measured at the at least one modulation frequency during the actual run of the processing system. The RF impedance is used as input 132 to the wafer temperature control system 128. If the wafer temperature measurement only needs to be taken every second, or so, the DC clamping voltage need only be modulated for a fraction of a second each time a temperature measurement is desired. For example, if the modulation frequency is 1000 Hz, 100 ms is enough time for the RF impedance to be measured by sampling the voltage and current signals. At times when the DC voltage is not modulated, the voltage power supply outputs a constant voltage, typically in the range of 500V to 2000V, as discussed before. So therefore, the modulation of the DC clamping voltage and mechanical excitation of the wafer is not done all of the time, but at short intervals necessary to make measurements, spaced by pauses determined by the required wafer temperature sampling rate.

At P320, the temperature of the wafer 110 is determined based upon a comparison of the measured RF impedance input 132 taken at P318 and the correlated temperature and RF impedance data of P310 for the plasma processing parameters used during experimental runs of P304 that most closely match the processing parameters of the actual run. Interpolation between calibration points for DC clamping voltage, backflow gas pressure, and plasma processing conditions is used in the temperature control system 128 to generate accurate wafer temperature readings in cases where parameters do not match exactly the values used during calibration, but fall within the ranges covered by experiments and calibrations. The use of multiple modulation frequencies, for example, simultaneous modulation at 1000 Hz, 2500 Hz, and 8000 Hz, provides the needed redundancy if one of the frequencies is currently experiencing RF interference from other plasma processing system components. Furthermore, averaging of wafer temperature estimates obtained independently from multiple modulation frequencies provides higher accuracy and repeatability. The in-situ temperature measurements taken directly by the temperature measurement system 122 are unnecessary during the actual processing run because the temperature of the wafer may be determined from the interpolation and correlation to RF impedance data taken at P318 and P310 in a system in which the RF impedance is measured at the modulation frequency or frequencies.

At P322, the wafer temperature control system 128 monitors and, if desired, adjusts the DC clamping voltage power supply 126 and the backflow gas pressure controller 118 based upon the temperature measurement obtained at P310 in order to maintain the wafer 110 at a desired temperature. The wafer temperature measurement obtained during the process is more accurate and less dependent on other plasma processing parameters. Furthermore, the wafer temperature may be monitored and controlled without adding additional equipment to the plasma processing system since the RF sensors exists in most processing tools, and the vast majority of DC power supplies can be programmed to modulate their output. The process ends at P324.

In an alternative embodiment, the backflow gas pressure may be modulated while the DC clamping voltage is held constant. For this embodiment, a modulating gas pressure controller is employed, and the oscillating gas pressure would cause the gas gap to vary; thus, causing impedance peaks to appear in the RF impedance spectrum, as illustrated in FIG. 5. Heat transfer gas may be injected into the microscopic gap via a single opening or in a zoned fashion as disclosed in provisional application 60/268,918 filed on Feb. 16, 2001, and incorporated herein by reference in its entirety. In particular, a plurality of gas holes may be connected to different gas sources that allow different types of gas to be injected into different zones within the gap. Thus, different portions of the wafer would be subjected to a different backflow gas pressure and may be modulated at different frequencies.

Figure 6:
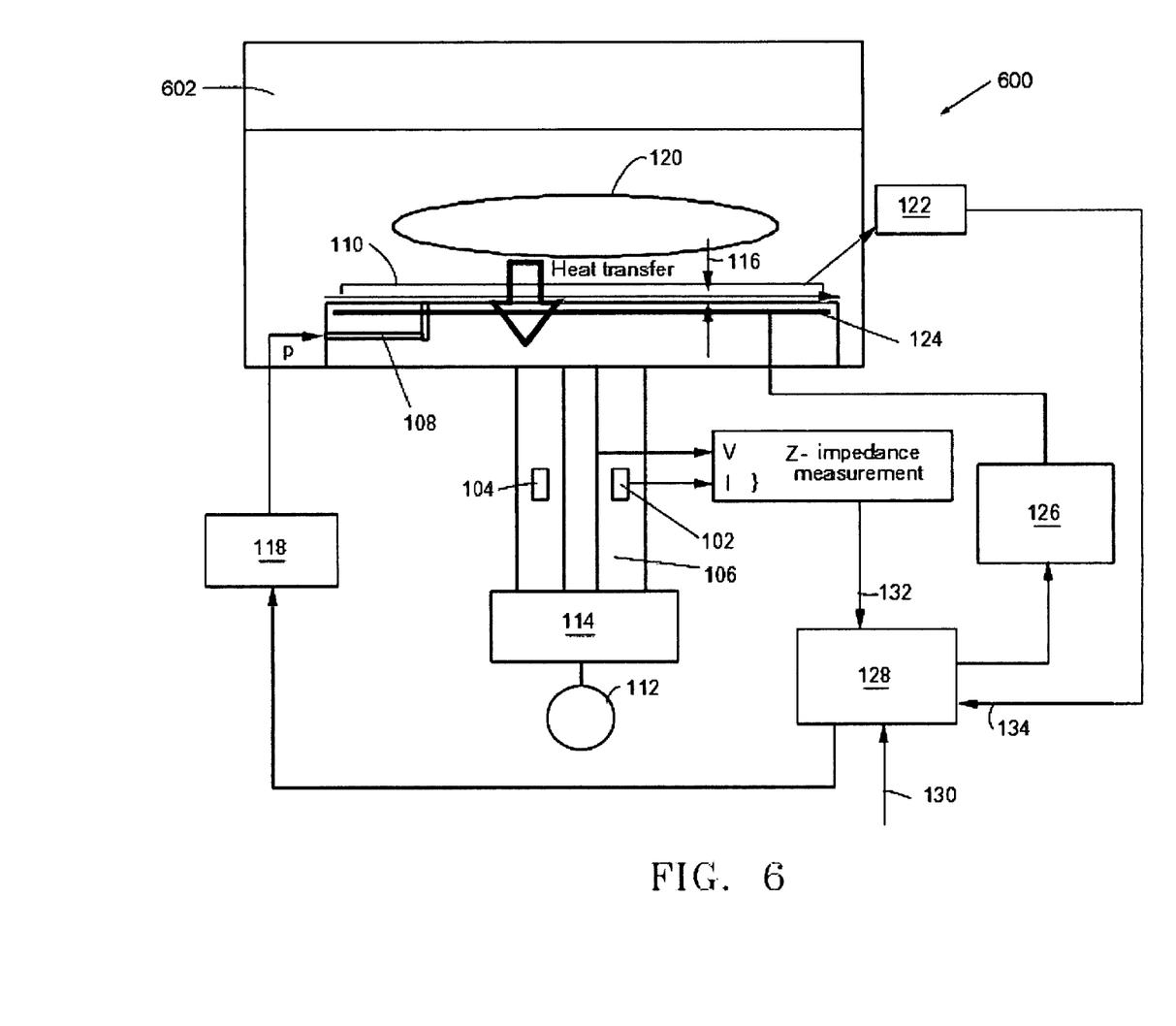
FIG. 6 illustrates a plasma processing system in accordance with an embodiment of the present invention.

FIG. 6 illustrates a plasma processing system for monitoring and controlling wafer temperature that includes a plasma source 602 in accordance with an embodiment of the present invention The plasma processing system may include a plasma source 602 of any type, such as a capacitive-coupled plasma source, a magnetically-enhanced capacitive coupled plasma source, an inductive-coupled plasma source, a transformer-coupled plasma source, an electron-cyclotron plasma source, a helicon plasma source, etc. The method of controlling and/or monitoring the plasma processing system of FIG. 6 are as described above with regard to FIGS. 2A and 2B.

The foregoing description of the embodiments of the present invention provides illustration and description, but is not intended to be exhaustive or to limit the invention to the precise form disclosed. Modifications and variations are possible consistent with the above teachings or may be acquired from practice of the invention. For example, the various features of the invention, which are described in the contexts of separate embodiments for the purposes of clarity, may also be combined in a single embodiment. Conversely, the various features of the invention which are, for brevity, described in the context of a single embodiment may also be provided separately or in any suitable sub-combination. Accordingly, persons skilled in the art will appreciate that the present invention is not limited to what has been particularly shown and described hereinabove. Rather, the scope of the present invention is defined only by the attached claims and their equivalents.

What is claimed is:

1. A method for monitoring wafer temperature during wafer processing, comprising:

measuring an impedance of a load within the wafer process;

determining a temperature of the wafer based upon the measured impedance:

setting a backflow gas pressure and a DC clamping voltage to a series of combinations of values;

measuring wafer temperature for the various processing parameters during the experimental runs at each of the combinations of backflow gas pressure and DC clamping voltage;

measuring impedance for each measured wafer temperature;

correlating the measured impedance to the measured wafer temperature to provide correlated data;

comparing the measured impedance and the correlated data to determine a temperature of the wafer; and controlling at least one of said backflow gas pressure and DC voltage to adjust said temperature of said wafer, wherein the impedance is measured at multiple frequencies of the DC clamping voltage during the experimental runs.

2. The method of claim 1, wherein said measuring of impedance includes measuring voltage and current in a transmission line of the wafer process.

3. The method of claim 2, further comprising modulating at least one of said dc voltage and said backflow gas pressure for at least one selected frequency.

4. The method of claim 3, wherein when the dc voltage is modulated the backflow gas pressure is set to a constant value, and wherein when the backflow gas pressure is modulated, the dc voltage is set to a constant value.

5. The method of claim 1, further comprising repeating said setting, said temperature measuring, said impedance measuring and said correlating for a series of sets of different processing parameters and wherein said comparing includes determining which of said sets of processing parameters is most similar to processing parameters for an actual process run.

6. The method of claim 1, further comprising controlling at least one of backflow gas pressure and dc voltage in response to said measuring to adjust said temperature of the wafer.

7. The method of claim 1, wherein the backflow gas pressure is set in a range of 1 Torr to 100 Torr.

8. The method of claim 1, wherein the dc clamping voltage is set in a range of 500 to 2000 volts.

* * * * *